United States Patent [19]
Bullington et al.

[11] Patent Number: 5,179,533
[45] Date of Patent: * Jan. 12, 1993

[54] READ/WRITE OPTICAL MEMORY

[75] Inventors: Jeff A. Bullington; Sylvia D. Mancha; Christopher DeHainaut, all of Albuquerque, N. Mex.

[73] Assignee: Radiant Technologies, Albuquerque, N. Mex.

[ * ] Notice: The portion of the term of this patent subsequent to Sep. 24, 2008 has been disclaimed.

[21] Appl. No.: 387,082

[22] Filed: Jul. 31, 1989

[51] Int. Cl.$^5$ .................. G11C 11/22; G11C 11/42
[52] U.S. Cl. .................. 365/110; 365/109; 365/117; 369/110
[58] Field of Search .............. 369/275.1, 275.5, 13, 369/110; 365/110, 109, 121, 117, 106

[56] References Cited

U.S. PATENT DOCUMENTS

| | | | |
|---|---|---|---|
| 3,680,060 | 7/1972 | Keneman | 365/110 |
| 3,855,579 | 12/1974 | Grenot | 365/121 |
| 3,868,653 | 2/1975 | Winter | 365/106 |
| 3,902,788 | 9/1975 | Strehlow | 365/109 |
| 3,973,247 | 8/1976 | Kumada et al. | 365/106 |
| 4,041,477 | 8/1977 | Drenckhan | 365/106 |
| 4,391,901 | 7/1983 | Land | 365/119 |
| 4,731,754 | 3/1988 | Ogden | 365/121 |
| 4,945,514 | 7/1990 | Land | 350/374 |
| 5,051,950 | 9/1991 | Evans, Jr. et al. | 365/117 |

Primary Examiner—Hoa Nguyen
Attorney, Agent, or Firm—McCubbrrey, Bartels, Meyer & Ward

[57] ABSTRACT

An improved read/write optical disk is disclosed which is capable of being rewritten more than $10^6$ times. The disk utilizes a storage medium in which data is stored by causing a localized region of the storage medium to assume one of two states. The two states can be converted from one to another by the application of electric fields to the localized region of the storage medium. The localized region in question is selected by illuminating an area on an addressing layer directly above the region in question with light. The preferred embodiment utilizes a lead lanthanum zirconate titanate material for the storage medium.

6 Claims, 3 Drawing Sheets

READ/WRITE OPTICAL MEMORY

FIELD OF THE INVENTION

The present invention relates to data storage devices and more particularly to an optical disk which may be read or written a number of times.

BACKGROUND OF THE INVENTION

Optically read and written memory devices have the potential of providing a significant advance in the data storage capacity of computer systems and the like. In principle, data storage capacities of the order of $10^{12}$ bits/m$^2$ of storage media are possible with such devices. However, in spite of intense research and development work, optical read/write memories based on existing technologies are at best a marginal improvement over conventional magnetic memories.

The most attractive of the currently available read/write optical disks are based on magneto-optic materials. These disks have latency times of about 100 ms and may be rewritten only about $10^4$ times. For comparison, conventional magnetic hard disks used in computer systems may be rewritten more than $10^6$ times and have latency times less than 20 ms. In addition to poor latency times and insufficient rewrite capability, the intensity of laser light required to store the information in magneto-optical media is of the order of $10^5$ watts/cm$^2$. This high intensity results from the need to thermally alter the phase of the magneto-optical media. To operate at these power densities, the laser diode used to write the magneto-optical media must operate near saturation. As a result, the life-time of the laser diode is significantly reduced.

In addition to requiring that the laser diodes be run near saturation, much larger area laser diodes must be used. The light from the diode is then concentrated on the appropriate location in the storage media. This concentration operation requires a long focal length lens which places a lower limit on the distance between the laser diode and the surface of the storage medium. This distance complicates the task of tracking on the disk, and limits the density of data that can be stored on such a disk.

Accordingly, it is an object of the present invention to provide an improved read/write optical disk.

It is a further object of the present invention to provide a read/write optical disk with lower latency times than currently available read/write optical disks.

It is yet another object of the present invention to provide a read/write optical disk which can be rewritten as many times as currently available magnetic hard disks.

It is a still further object of the present invention to provide a read/write optical disk which requires less power to write then prior art read/write optical disks.

It is a yet another object of the present invention to provide a read/write optical disk with a lighter weight reading mechanism than that of prior art read/write optical disks.

These and other objects of the present invention will become apparent to those skilled in the art from the following detailed description of the invention and the accompanying drawings.

SUMMARY OF THE INVENTION

The present invention comprises a read/write optical memory including a storage layer, optical addressing layer, top electrode and bottom electrode. The storage layer comprises a layer of storage material having first and second storage states. The first storage state results from the application of a first electric field to the storage material. The second storage state results from the application of a second electric field to the storage material. The optical addressing layer comprises a layer of photosensitive material bonded to the layer of storage material. The photosensitive material conducts electricity when illuminated by light having a wavelength less than a predetermined wavelength and is substantially an electrical insulator in the absence of such light. The dielectric constant of the photosensitive material is substantially less than that of said storage material. The top electrode includes a conducting coating bonded to the surface of the layer of photosensitive material on the surface thereof which is not bonded to said storage material. The bottom electrode includes a conducting coating bonded to the surface of the layer of storage material on the surface thereof which is not bonded to the photosensitive material. At least one of said top and bottom electrodes is transparent to light of said first predetermined wavelength. The present invention also includes a means for directing a light beam having a wavelength less than or equal to said predetermined wavelength to a localized area on the optical addressing means and a means for applying first and second potential differences between said top and bottom electrodes. The first potential difference being of a magnitude and direction such that said first potential difference would generate said first electric field in said layer of storage material if applied solely across said layer of storage material and the second potential difference being of a magnitude and direction such that said second potential difference would generate said second electric field in the layer of storage material if applied solely across the layer of storage material.

DETAILED DESCRIPTION OF THE INVENTION

Figure 1A:
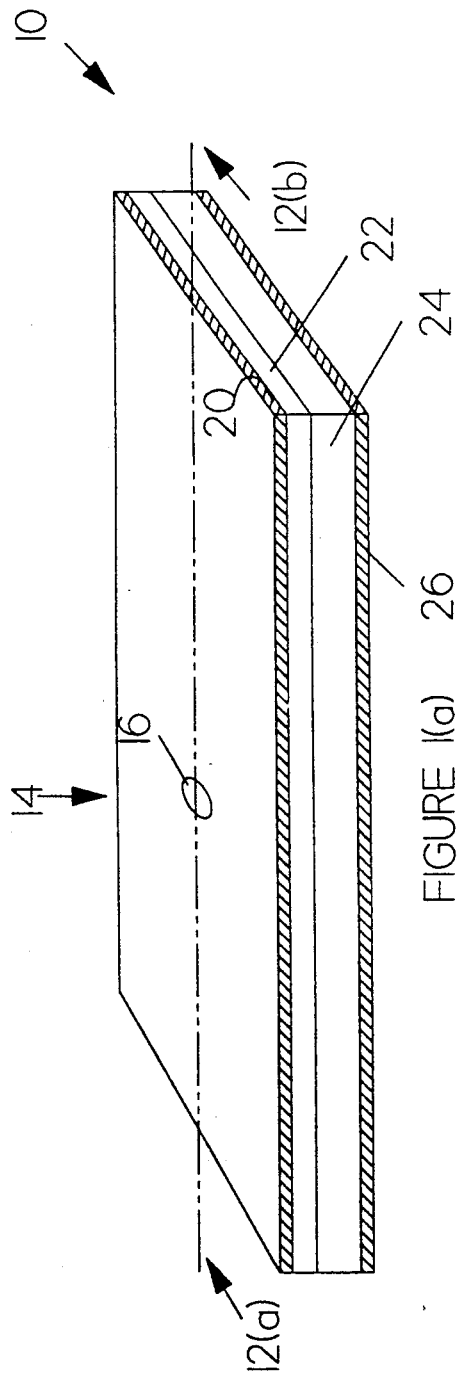
FIG. 1(a) is a perspective view of a memory structure according to the present invention.
Figure 1B:
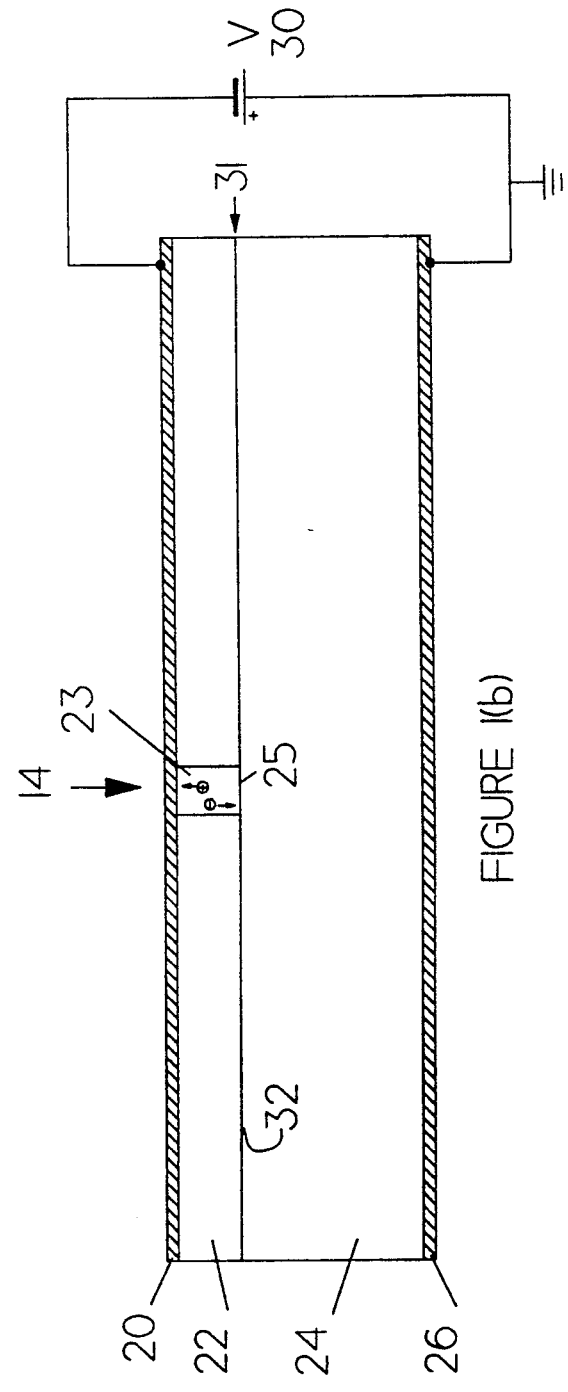
FIG. 1(b) is a cross-sectional view of the memory structure shown in FIG. 1(a).

The manner in which a memory according to the present invention is constructed and operated is more easily understood with reference to FIGS. 1(a)–(b). FIG. 1(a) is a perspective view of a memory structure 10 according to the present invention. FIG. 1(b) is a cross-sectional view of memory structure 10 taken through line 12a–12b.

Memory structure 10 is a layered structure in which data bits are stored by altering the properties of the structure at various physical points in one of the layers. The specific point is selected by directing a narrow beam of laser light 14 to the appropriate point on the surface of memory structure 10 thereby illuminating the location corresponding to the desired data bit. Such a spot of light is shown at 16. As will be explained in more detail below, the storage material at the point so illuminated is subjected to an electric field which alters the structure of the material.

Memory structure 10 comprises four layers which are preferably planar. The top layer comprises a first electrode 20 which is preferably transparent to light of the wavelengths discussed below. The second layer 22 will be referred to as an addressing layer. This layer is used in conjunction with the light beam 14 to select a particular storage location for writing. The third layer is used to store the actual data and will be referred to as storage layer 24. Finally, the fourth layer comprises a second electrode 26.

Storage layer 24 is preferably constructed from a storage material which undergoes a structural change when subjected to an electric field. The structural change is preferably one that will remain when the electric field is removed and that can be sensed in a convenient manner to allow the reading of the stored data. For the purposes of the present invention, storage layer 24 is preferably constructed from lead lanthanum zirconate titanate (PLZT). The PLZT material is a structure of the form $ABO_3$ where the A site may be filled by either lead or lanthium and the B site may be filled with either zirconium or titanium. The preferred embodiment of the present invention utilizes a composition $Pb_{0.93}La_{0.076}(Zr_{0.70}Ti_{0.30})_{0.98}O_3$, which will be abbreviated 7.6/70/30 PLZT. Other compositions will be apparent to those skilled in the art.

Figure 2A:
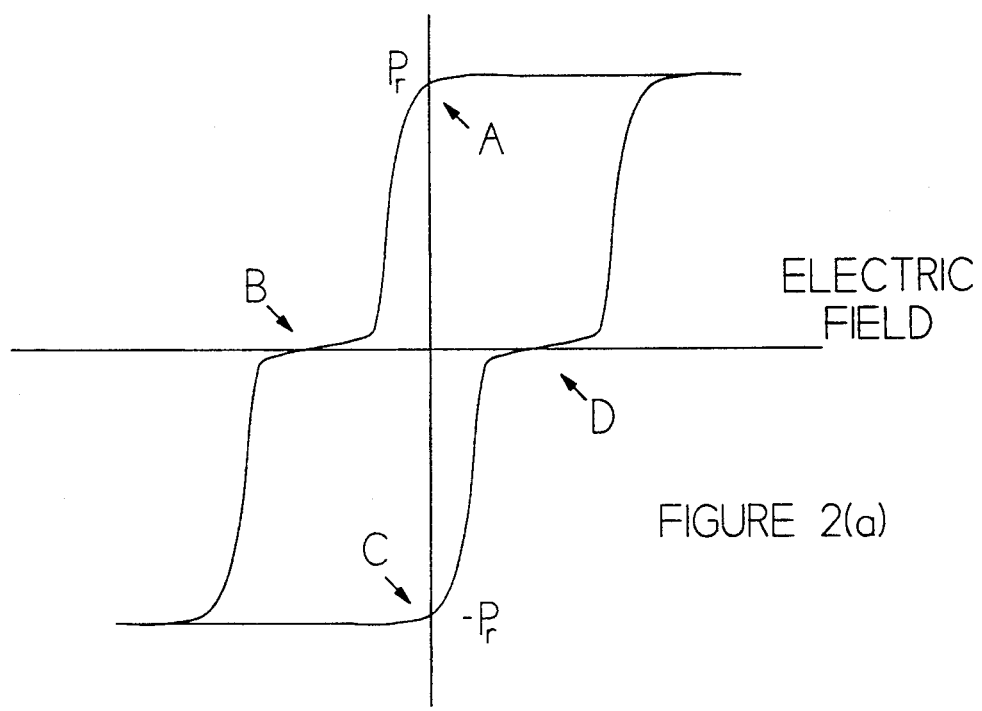
FIG. 2(a) illustrates the manner in which the polarization and index of refraction of the material used to construct a storage layer according to the present invention vary as a function of voltage differences applied thereto.

A typical hysteresis curve for 7.6/70/30 PLZT at room temperature is shown in FIGS. 2(a,b). This composition is characterized by an anti-ferroelectric phase (AFE) with a metastable field-induced ferroelectric (FE). That is, the material is AFE until an electric field is applied to the ceramic. The electric field induces an FE phase and the material behaves as a ferroelectric material. The transistion between the AFE phase and the field-induced FE phase begins at point A in FIG. 2(a). Point B is the beginning of the phase transition from AFE to FE, point C is the beginning of the phase transition from FE to AFE, and point D is the beginning of the transition from AFE to FE.

The present invention utilizes this voltage-mediated phase change to store binary values at predetermined locations in storage layer 24. As will be explained in more detail below, a given storage location is specified by illuminating the area over said storage location with light of the appropriate wavelength. As a result of this illumination, a voltage is applied across that portion of storage layer 24. This voltage causes the material of storage layer 24 to undergo a phase transition at the location in question. For example, the material will change from FE to AFE. When the voltage is removed, the material remains in the phase specified by the applied voltage.

A single bit of data is stored by causing a predetermined location in storage 24 to assume one of two states. For example, a one can be stored by placing the material in the AFE phase and a zero by placing the material in the FE phase. The data is read by measuring the optical properties of the material at the location assigned to the bit in question.

The different phases of the storage media used to construct storage layer 24 have different optical properties. Hence, the data stored at any given location can be ascertained by illuminating the location in question with a laser beam and observing the properties of the light after passing through the location in question.

For example, Kumada, et al. [A Kumada, G. Toda, and Y. Otomo, "An Electrooptic Image Storage Device Using Field Induced Reversible Transitions Between AFE and FE phases of PLZT Ceramics", Ferroelectrics 7, pp 367-369, 1974] have shown that 7.6/70/30 PLZT ceramics can be reversibly switched between the AFE (antiferroelectric) and FE (ferroelectric) phases by the application of an electric field of several kV/cm. In the AFE phase, the material does not scatter light; however, in the FE phase light scattering occurs. Hence, the state of the material can be ascertained by illuminating the material with linearly polarized light and observing the polarization of the light after passing through the material. If the material is in the AFE phase, no change in polarization will occur. However, if the material is in the FE phase, light will be scattered in a narrow angle resulting in the depolarization of the light. Hence, the state of the material can be ascertained with a polarization analyzer and light detector.

The preferred embodiment of the present invention utilizes a thin film for storage layer 24. As a result, differences in polarization arising from the above described light scattering are too small to provide a practical method for reading data. Hence, the present invention preferably utilizes differences in the index of refraction of two states of the material in storage layer 24. The differences in index of refraction may be sensed by observing the rotation of the plane of polarization of linearly polarized light after said light passes through the storage layer.

It will be apparent to those skilled in the art that it is advantageous to maximize the differences in index of refraction between the state corresponding to a one and that corresponding to a zero. The two states having the maximum difference in index of refraction when no voltage is applied to the PLZT material are the state in which the PLZT material has an index of refraction of $n_0$ (polarization equal to zero) and one of the states in which the index of refraction is $n_1$ (polarization equal to $\pm P_r$). For the purposes of this discussion, the state with polarization $-P_r$ will be used. This state will be assumed to represent a binary one. The state with zero polarization will be defined to represent a binary zero.

Figure 2B:
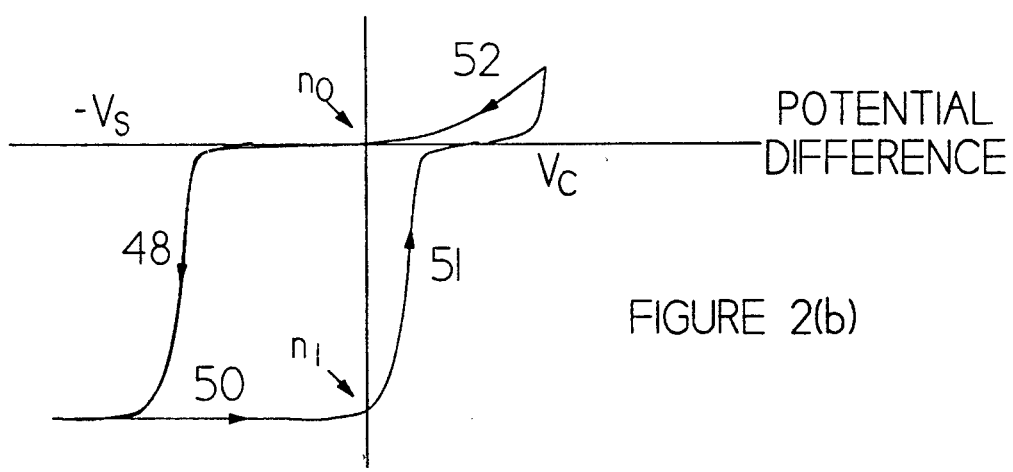
FIG. 2(b) illustrates the manner in which data is written into a memory structure according to one embodiment of the present invention.

Referring to FIG. 2(b), a binary one is written by applying a voltage difference of $-V_S$ to the sample which causes the polarization to change as shown by curve 48. This voltage is then removed to zero which causes the polarization to change as shown by curve 50. At this point, a binary one is stored in the material. To store a binary zero, a positive voltage of $V_C$ is applied to the sample which causes the polarization to increase as shown on curve 51. $V_C$ is approximately equal to $V_S/2$ for the above mentioned PLZT materials. Upon removing this positive voltage, the polarization will return to a value of substantially zero along curve 52. At this point, the material has an index of refraction of $n_0$ and a data value corresponding to a binary zero will be stored. Because of the hysteresis of the material, a binary zero may only rewritten after the material has been first set to the binary one state.

Referring again to FIG. 1(a)-(b), addressing layer 22 in conjunction with light beam 14 are used to select the physical location at which data is written into storage layer 24. Addressing layer 22 must have two properties.

First, in the absence of light having a wavelength shorter than that of light beam 14, addressing layer 22 must be an insulator with a dielectric constant which is much smaller than that of storage layer 24. For the purposes of this discussion, it will be assumed that the difference in dielectric constants is so large that any potential difference V applied between electrodes 20 and 26 by battery 30 will appear primarily across addressing layer 22. That is, the potential of the top surface 31 of storage layer 24 will be substantially equal to ground.

Second, addressing layer 22 must be photoconductive in the presence of light having a wavelength less than or equal to that of light beam 14. In the preferred embodiment of the present invention, this wavelength is selected to be less than 488 nm. Light beams of this wavelength may be obtained utilizing an Argon laser.

An addressing layer with these properties can be constructed by ion implantation of the upper region of storage layer 24 prior to depositing electrode 20. For example, ion implantation with $1 \times 10^{15}$ (1.3 Mev) Al/cm$^2$ and $2.4 \times 10^{15}$ (1.3 Mev) Ne/cm$^2$ has been found to be satisfactory for creating an addressing layer with the above described photosensitivity. The ion implantation process alters the physical structure of the surface of storage layer 24 such that the dielectric constant of the ion implanted region is substantially less than that of the unimplanted regions of storage layer 24.

Assuming that addressing layer 22 has the above mentioned properties, voltage can be applied to a localized area of storage media 24 by exposing the surface of addressing layer 22 directly above the area in question to light beam 14. In this case, light beam 14 will cause the portion 23 of addressing layer 22 so illuminated to become photoconductive. The holes and electrons so created will conduct the voltage present on electrode 20 to the surface of storage layer 24 as shown at location 25. In effect, addressing layer 22 will be locally shorted out. As a result, the voltage difference supplied by battery 30 will now appear across storage layer 24 at location 25. Other areas of storage layer 24 such as location 32 will remain at essentially ground potential. Hence, the voltage difference will only appear across the area corresponding to the selected data bit.

In the above discussion, it was assumed that the differences in dielectric constants between addressing layer 22 and storage layer 24 were so large that the difference in voltage between electrodes 20 and 26 appeared across addressing layer 22 in the absence of said addressing layer being illuminated. It will be apparent to those skilled in the art that small differences in dielectric constants may be tolerated. The difference in dielectric constants need only be sufficient to guarantee that the fraction of the voltage difference between the electrodes in question that appears across storage layer 24 is less than the voltage difference needed to substantially alter the index of refraction of the material in storage layer 24.

Storage layer 24 may be deposited on a suitable substrate using sputtering, chemical vapor deposition or sol gel deposition. The preferred method of deposition is the conventional sol gel deposition technique. In this technique, a solution of the PLZT material is spun onto the substrate. The solution consists of a solvent carrying a metal organic complex which has been partially gelled into long chains. The chains consist of a linear array of metal atoms alternating with oxygen atoms and coordinated with hydrocarbon groups along the outside of the linear array. The chains are normally formed by hydrolysis of alkoxides which are individual metal atoms bonded to the hydrocarbons. The alkoxides are mixed to produce the desired ratio of metal atoms in the final ceramic and then water is added to the mixture. The water hydrolyzes the individual alkoxide molecules into the chains which remain suspended in the solvent. In this way, metal oxide molecules are dissolved in solvents such as simple alcohols.

The sol gel is spun onto the substrate using a conventional spinning apparatus. The solvent evaporates during the spinning, leaving the surface of the substrate coated with metal organic chains. The substrate is then heated gradually to evaporate the remaining solvent. After the solvent has been evaporated, the coated substrate is heated further to break the hydrocarbon bonds. As a result, hydrogen, carbon and oxygen are released, leaving a coating of metals and oxygen. The substrate is then raised to a temperature which sinters the amorphous layer into its ceramic form. For PLZT, the hydrocarbons evaporate below 400 degrees Centigrade. The substrate is then heated to a temperature above 550 degrees Centigrade for at least 20 minutes to form a perovskite phase ceramic.

If the sintering takes place between 400 and 500 degrees Centigrade, a pyrochlore structure will be formed. Such a structure has a dielectric constant below 50. Hence, an alternative method for creating addressing layer 22 comprises spinning a separate layer on storage layer 24 and sintering that layer at a lower temperature. Since PLZT materials are photoconductive for wavelengths less than 360 nm, such an addressing layer would require the use of a light source in the near ultra-violet during the writing operation. Alternatively, the material could be doped with materials such as the Al and Ne as described above.

The thickness of the layer deposited by one spin is determined by the viscosity of the gel, the spin speed, and the composition of the gel. If too thick a layer is deposited, the layer will crack during sintering. Hence, the preferred thickness is from 0.05 microns to 0.15 microns. Thicker films are fabricated by depositing multiple layers.

Figure 3:
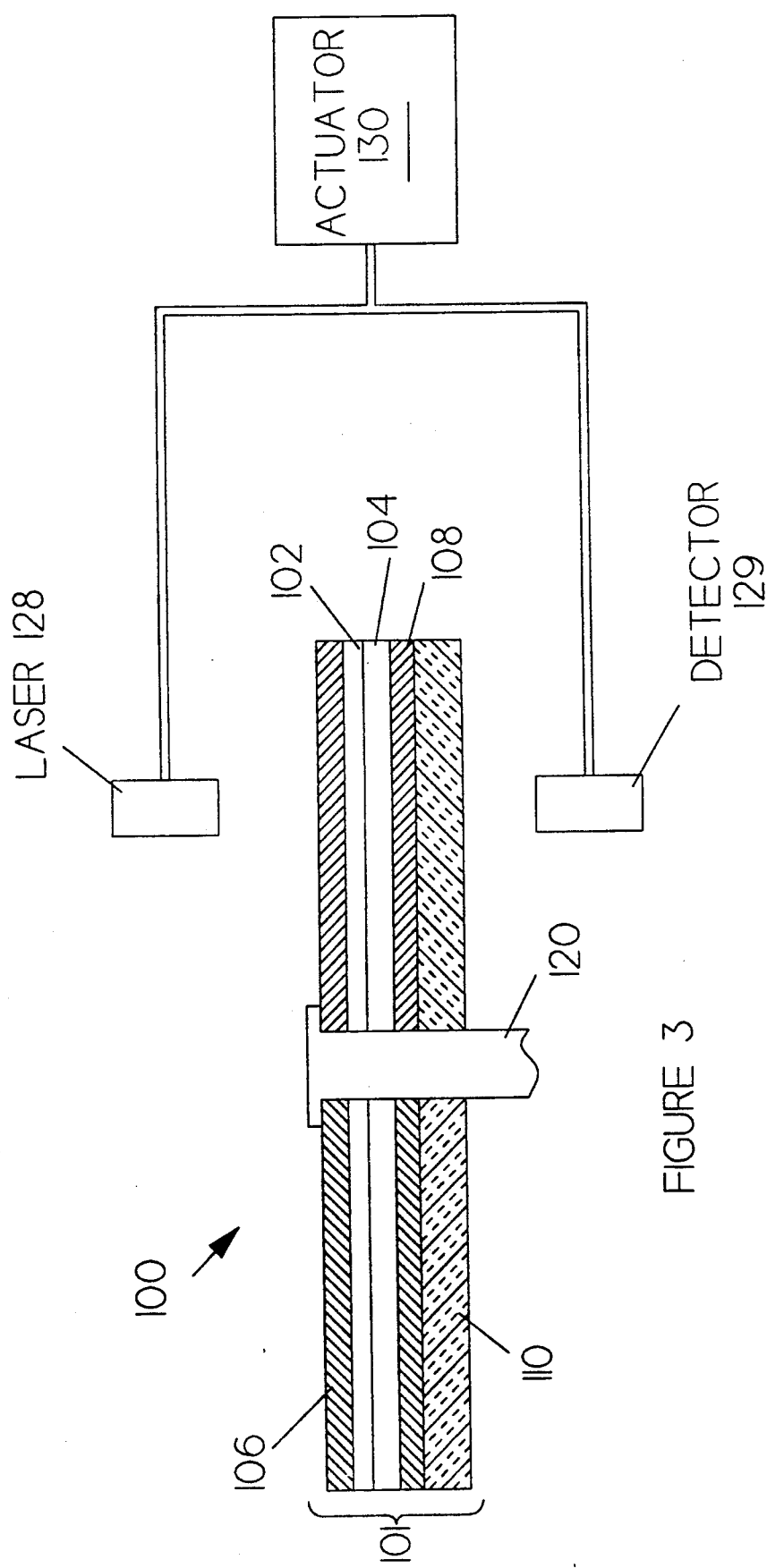
FIG. 3 is a cross-sectional view of a rotating optical disk memory according to the present invention.

A cross-sectional view of a rotating read/write optical memory according to the present invention is shown at 100 in FIG. 3. Memory 100 includes a platter 101 which is similar to that shown in FIGS. 1(a)-(b). Platter 101 includes an addressing layer 102 and storage layer 104. Electrodes 106 and 108 are bonded to the outer surfaces of addressing layer 102 and storage layer 104, respectively. These layers and electrodes are deposited on a suitable substrate 110.

Platter 101 is mounted on a spindle 120 which rotates. A laser 128 moves radially with respect to spindle 120 such that the combination of said radial rotational motions allows any storage location on platter 101 to be illuminated by laser 128. A detector 129 is coupled to laser 128 for detecting the polarization of the laser light passing through platter 101 during read operations. Laser 128 and detector 129 are positioned by actuator 130.

It will be apparent to those skilled in the art that platter 101 must be transparent to the light from laser 128. It will also be apparent the embodiments in which detector 129 is located on the same side of platter 101 as laser 128 may be constructed. In such embodiments, electrode 108 can be made from a reflective coating. In this case, only electrode 106, addressing layer 102, and storage layer 104 need be transparent.

It should be noted that the present invention utilizes the laser light only to specify a location on the storage media, not to change the phase of the storage media at that location. Prior art storage devices utilize thermally induced phase changes in which the thermal energy is supplied by the laser light. As noted above, this requires high power lasers and optical assemblies which limit the performance and reliability of the optical disk.

In contrast, the present invention does not require high power densities; hence, smaller laser diodes and shorter focal length lenses may be utilized. The present invention requires power densities of the order of 100 milliwatts/cm$^2$. In contrast, power densities of the order of 50,000 watts/cm$^2$ are required for changing the phase of the materials in prior art devices. This lower power requirement results in a reduction in the distance between the surface of platter 101 and the head which carries the laser 128 used for addressing a specific location on the optical disk. In addition, the weight of these components is significantly less in an optical disk according to the present invention. The decrease in distance between the platter surface and the laser allows the present invention to provide significantly higher data densities than prior art devices. The reduction in weight improves the "seek" time of the read/write head.

There has been described herein a read/write optical memory. Various modifications to the present invention will become apparent to those skilled in the art from the foregoing description and accompanying drawings. Accordingly, the present invention is to be limited solely by the scope of the following claims.

What is claimed is:

1. A read/write optical memory comprising
    storage means comprising a layer of storage material, said storage material having first and second storage states, said first storage state resulting from the application of a first electric field to said storage material and said second storage state resulting from the application of a second electric field to said storage material, the magnitude of the polarization of said storage material in said first state being different from the magnitude of the polarization of said storage material in said second state;
    optical addressing means comprising a layer of photosensitive material bonded to said layer of storage material, said photosensitive material conducting electricity when illuminated with light having a wavelength less than a predetermined wavelength and substantially being an electrical insulator in the absence of said light, the dielectric constant of said photosensitive material being substantially less than that of said storage material;
    top electrode means comprising a conducting coating bonded to the surface of said layer of photosensitive material on the surface thereof which is not bonded to said storage material material;
    bottom electrode means comprising a conducting coating bonded to the surface of said layer of storage material on the surface thereof which is not bonded to said photosensitive material, wherein at least one of said top and bottom electrodes is transparent to light of said first predetermined wavelength;
    means for directing a light beam having a wavelength less than or equal to said predetermined wavelength to a localized area on said optical addressing means; and
    means for applying first and second potential differences between said top and bottom electrodes, said first potential difference being of a magnitude and direction such that said first potential difference would generate said first electric field in said layer of storage material if applied solely across said layer of storage material and said second potential difference being of a magnitude and direction such that said second potential difference would generate said second electric field in said layer of storage material if applied solely across said layer of storage material.

2. The read/write optical memory of claim 1 wherein said storage material comprises a Lead Lanthanum Zirconate Titanate.

3. The read/write optical memory of claim 2 wherein said first storage state is a ferro-electric state and said second storage state is an anti-ferro-electric state.

4. The read/write optical memory of claim 2 wherein said Lead Lanthanum Zirconate Titanate has a composition substantially equal to 7.7/70/30.

5. The read/write optical memory of claim 1 wherein said photosensitive material comprises a PLZT layer which has been ion implanted.

6. The read/write optical memory of claim 5 wherein said ion implantation comprises implanting ions an element chosen from the group comprising Al and Ne.

* * * * *

UNITED STATES PATENT AND TRADEMARK OFFICE
CERTIFICATE OF CORRECTION

PATENT NO. : 5,179,533
DATED : January 12, 1993
INVENTOR(S) : Bullington, et al

It is certified that error appears in the above-indentified patent and that said Letters Patent is hereby corrected as shown below:

On the title page, before item [57] Abstract, the Attorney, Agent, or Firm—delete "McCubbrrey" and insert therefor --McCubbrey--.

Column 4, line 63, after "only" insert --be--.

Column 6, line 65, delete "the and insert therefor --that--.

Column 8, line 47, after second occurrence of "ions" insert --of--.

Signed and Sealed this

Ninth Day of November, 1993

Attest:

BRUCE LEHMAN

*Attesting Officer*  *Commissioner of Patents and Trademarks*